United States Patent
Kobayashi et al.

(10) Patent No.: US 8,895,952 B2
(45) Date of Patent: Nov. 25, 2014

(54) NONVOLATILE STORAGE DEVICE

(75) Inventors: Shigeki Kobayashi, Kuwana (JP);
Kazuhiko Yamamoto, Yokohama (JP);
Kenji Aoyama, Yokohama (JP); Shigeto Oshino, Kawasaki (JP); Kei Watanabe, Tokyo (JP); Shinichi Nakao, Yokohama (JP); Satoshi Ishikawa, Yokohama (JP);
Takeshi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 198 days.

(21) Appl. No.: 13/404,678

(22) Filed: Feb. 24, 2012

(65) Prior Publication Data
US 2012/0217464 A1 Aug. 30, 2012

(30) Foreign Application Priority Data
Feb. 28, 2011 (JP) .................... 2011-42946

(51) Int. Cl.
*H01L 45/00* (2006.01)
*H01L 27/24* (2006.01)
(52) U.S. Cl.
CPC ........ *H01L 27/2481* (2013.01); *H01L 27/2409* (2013.01); *H01L 45/149* (2013.01); *H01L 45/04* (2013.01)
USPC ..................... 257/4; 257/E45.001
(58) Field of Classification Search
USPC .......................................... 257/4
See application file for complete search history.

(56) References Cited

U.S. PATENT DOCUMENTS

| 2009/0251940 A1* | 10/2009 | Ito ................................... 365/51 |
| 2010/0038617 A1* | 2/2010 | Nakajima et al. ................ 257/2 |
| 2010/0181546 A1 | 7/2010 | Yamamoto et al. |
| 2011/0049463 A1* | 3/2011 | Yamamoto et al. ............... 257/4 |

FOREIGN PATENT DOCUMENTS

| JP | 2007-134678 | 5/2007 |
| JP | 2008-166591 | 7/2008 |
| JP | 2010-141046 | 6/2010 |
| JP | 2011-49455 | 3/2011 |

\* cited by examiner

*Primary Examiner* — Marc Armand
*Assistant Examiner* — Lawerence Tynes, Jr.
(74) *Attorney, Agent, or Firm* — Oblon, Spivak, McClelland, Maier & Neustadt, L.L.P.

(57) ABSTRACT

A nonvolatile storage device is formed by laminating a plurality of memory cell arrays, the memory cell array including a plurality of word lines, a plurality of bit lines, and memory cells. The memory cell includes a current rectifying device and a variable resistance device, the variable resistance device includes a lower electrode, an upper electrode, and a resistance change layer including a conductive nano material formed between the lower electrode and the upper electrode, one of the variable resistance devices provided adjacent to each other in the laminating direction has titanium oxide (TiOx) between the resistance change layer and the lower electrode serving as a cathode, the other of the variable resistance devices provided adjacent to each other in the laminating direction has titanium oxide (TiOx) between the resistance change layer and the upper electrode serving as a cathode.

8 Claims, 6 Drawing Sheets

FIG. 7
| LOWER ELECTRODE | Pass | Fail |
|---|---|---|
| TiN | 56.1 % | 43.9 % |
| W | 15.1 % | 84.9 % |
FIG. 8A
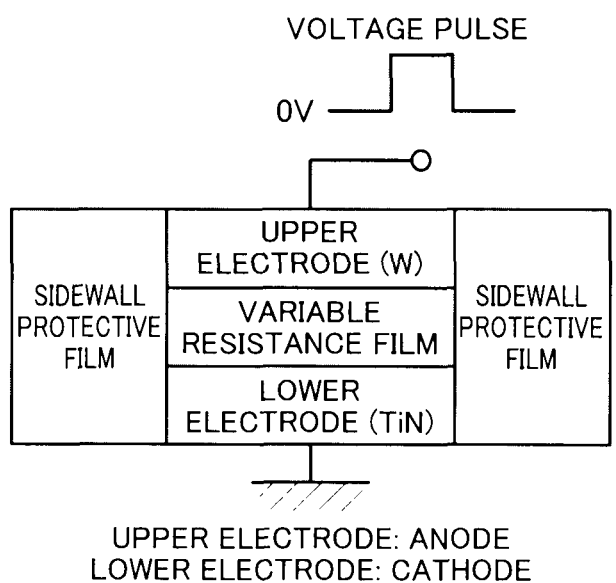
UPPER ELECTRODE: ANODE
LOWER ELECTRODE: CATHODE
FIG. 8B
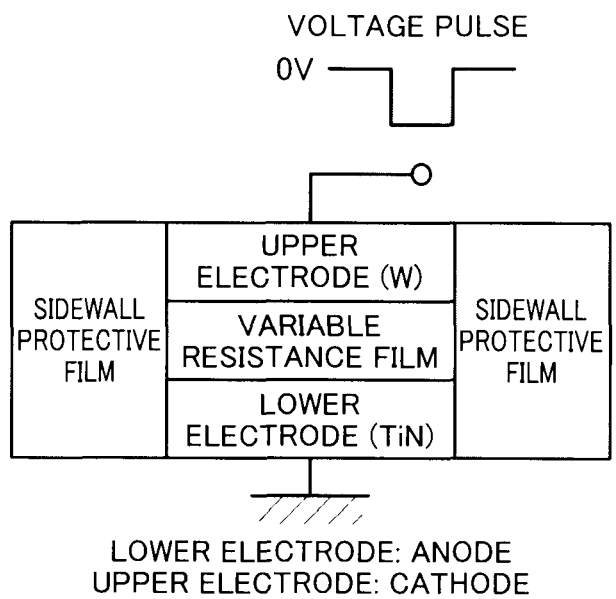
LOWER ELECTRODE: ANODE
UPPER ELECTRODE: CATHODE

| UPPER ELECTRODE /LOWER ELECTRODE | Pass | Fail |
|---|---|---|
| ANODE/CATHODE | 56.1 % | 43.9 % |
| CATHODE/ANODE | 4.5 % | 95.5 % |

NONVOLATILE STORAGE DEVICE

CROSS-REFERENCE TO RELATED APPLICATIONS

This application is based upon and claims the benefit of priority from the prior Japanese Patent Application No. 2011-42946, filed on Feb. 28, 2011, the entire contents of which are incorporated herein by reference.

FIELD

Embodiments described herein relate to a nonvolatile storage device.

BACKGROUND

Description of the Related Art

In recent years, along with the spread of portable information terminals and digitalization of information, demand for small-sized but large-capacity information recording/reproducing devices or so-called storage devices is rapidly expanding. Among them, NAND-type flash memories and small hard disk drives (HDD) are widely used as the recording density increases.

Further increase in the recording density and in the capacity is more strongly demanded, and smaller size, higher density, and higher speed are required, which are difficult to achieve with conventional devices. Accordingly, a resistance change-type nonvolatile memory that records information as different resistance values attracts attention as an improved device.

In the resistance change-type nonvolatile memory, a memory cell is constituted by a resistance change layer and electrodes sandwiching the resistance change layer. The resistance change layer stores two or more different electric resistance states, such as a low resistance state and a high resistance state, in a nonvolatile manner. That is, the resistance state of the resistance change layer is changed by applying voltage, current, charge, heat or the like, which is equal to or more than a threshold value, to the electrodes, whereby difference in the resistance value is recorded in association with data. The resistance change-type nonvolatile memory has a feature of capable of reading data in a nondestructive manner.

Currently, binary metal oxides such as nickel oxide (NiO) and multicomponent metal oxides such as strontium zirconium oxide ($SrZrO_3$) have been actively researched and developed as materials of resistance change-type memory devices. However, it is difficult to produce metal oxides by controlling composition and crystal structure, and there is a high degree of electric characteristic instability and variation of the resistance change film which are considered to be caused by low controllability of the composition and the crystal structure. Therefore, it is difficult to obtain desired electric characteristics with a high degree of reproducibility. Materials suitable for the resistance change layer have been searched for, but a suitable material has not yet been found.

Carbon materials are also considered as candidates for the resistance change layer, and materials and production methods therefor have been researched. The carbon material is constituted by a single carbon, and therefore, the composition can be controlled relatively easily with less dependence on process conditions, and there is an advantage in that the control is easy.

However, unless a carbon film is produced at a high temperature with a high pressure, a so-called graphite structure is easily formed. Therefore, the electric resistivity is low. When the electric resistivity is too low, a large current has to flow in a memory cell in order to change the electric resistance state, which increases power consumption. The change of the resistance state is considered to be caused by difference in the combination state between carbons in the film (combination of sp3 and sp2), and it is estimated that a large current is required in order to change the combination state, and it may be difficult to reduce the current required for changing the resistance.

Among the same carbon films, a carbon nano material is also a candidate for the resistance change memory device. The carbon nano material is a generic term meaning carbon materials having a three-dimensional structure such as carbon nanotube and fullerene. The layer in which the carbon nano material is laminated is different from a bulk film formed as a uniform film in that the layer with the carbon nano material has a three-dimensional structure in which minute tubes are stacked and there is much space, and therefore, a current path is spacially-limited. Therefore, even though the carbon nano material itself is a conductive material, a small current flows in the carbon nano material layer, making it possible to reduce the current required to change the electric resistance state of the carbon nano material layer.

The mechanism of change of the resistance in the carbon nano material layer has not yet been revealed in detail. However, with the current-limiting mechanism unique to the above carbon nano material, the resistance change-type memory using the carbon nano material has a possibility of reducing the current required to change the electric resistance state. Therefore, the resistance change-type memory using the carbon nano material attracts attention.

BRIEF DESCRIPTION OF THE DRAWINGS

FIG. 7 is a table illustrating a switch operation characteristic of the experiment sample;

FIGS. 8A and 8B are schematic views for explaining a voltage application method for the experiment sample;

DETAILED DESCRIPTION

A nonvolatile storage device according to an embodiment is formed by laminating a plurality of memory cell arrays, the memory cell array including a plurality of word lines arranged in parallel, a plurality of bit lines arranged in parallel and crossing these word lines, and memory cells each connected between a word line and a bit line at a crossing portion between the word line and the bit line, the plurality of memory cell arrays being laminated in such a manner as to share adjacent word lines and bit lines, wherein the memory cell includes a current rectifying device and a variable resistance device connected in series, the current rectifying devices provided adjacent to each other in a laminating direction pass currents in directions opposite to each other, the variable resistance device includes a lower electrode, an upper electrode, and a resistance change layer including a conductive nano material formed between the lower electrode and the upper electrode, one of the variable resistance devices provided adjacent to each other in the laminating direction has titanium oxide (TiOx) between the resistance change layer and the lower electrode serving as a cathode, the other of the variable resistance devices provided adjacent to each other in the laminating direction has titanium oxide (TiOx) between the resistance change layer and the upper electrode serving as a cathode.

Hereinafter, embodiments will be described with reference to the attached drawings.

[First Embodiment]

[Entire Configuration]

Figure 1:
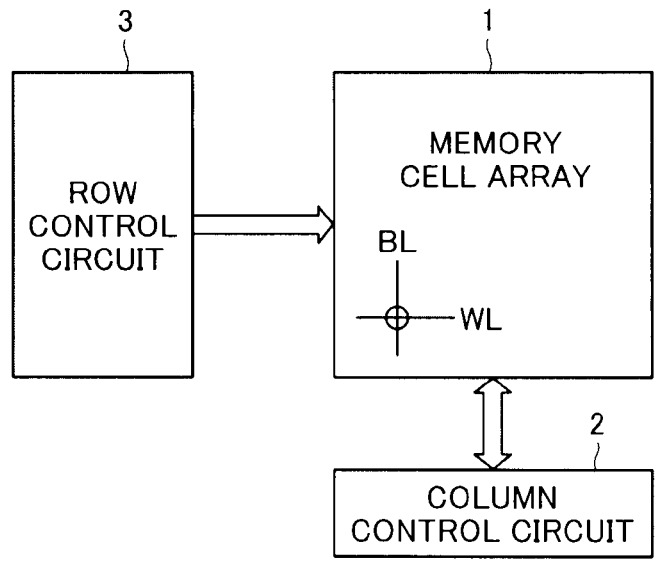
FIG. 1 is a block diagram illustrating a configuration of a nonvolatile storage device according to a first embodiment of the present invention.

FIG. 1 is a block diagram illustrating a configuration of a nonvolatile semiconductor storage device according to the first embodiment of the present invention. This nonvolatile semiconductor storage device includes a memory cell array 1 in which memory cells MC having variable resistance devices and current rectifying devices described later are arranged in a matrix form.

A column control circuit 2 is electrically connected to bit lines BL of the memory cell array 1. The column control circuit 2 controls the bit lines BL of the memory cell array 1, and enables data erase operation of a memory cell, data write operation to a memory cell, and data read operation from a memory cell. A row control circuit 3 is electrically connected to word lines WL of the memory cell array 1. The row control circuit 3 selects the word lines WL of the memory cell array 1, and enables data erase operation of a memory cell, data write operation to a memory cell, and data read operation from a memory cell.

[Memory Cell Array]

Figure 2:
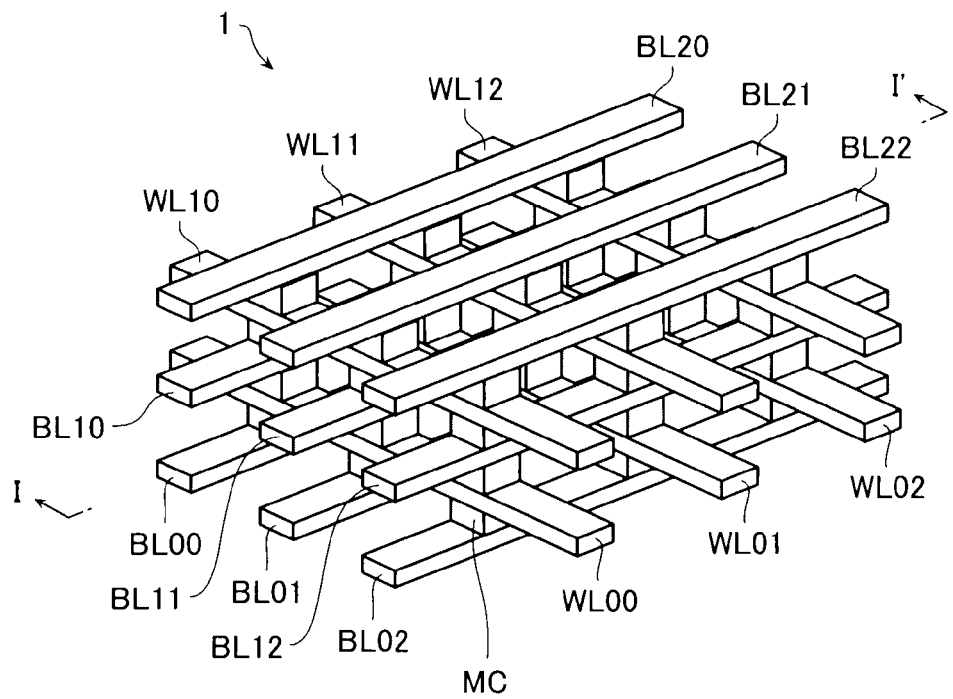
FIG. 2 is a perspective view illustrating a portion of a memory cell array of the nonvolatile storage device according to the embodiment.
Figure 3:
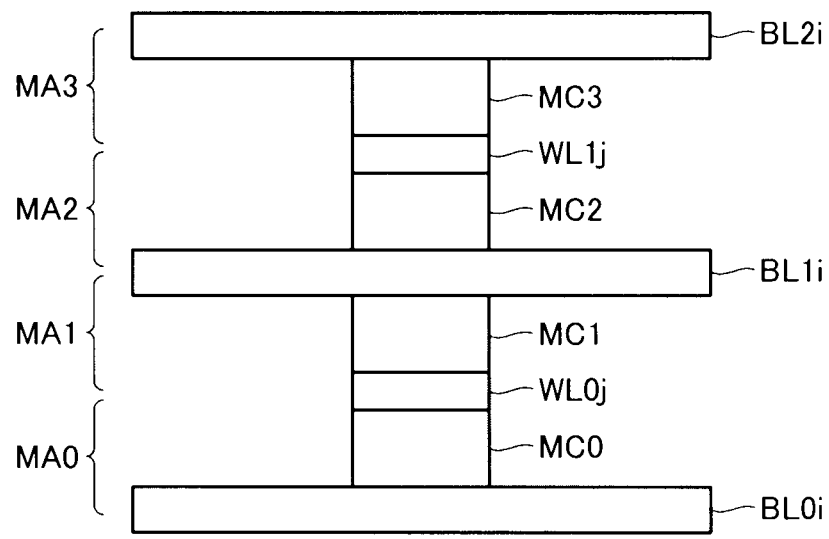
FIG. 3 is a cross sectional view illustrating a portion of the memory cell array of the nonvolatile storage device according to the embodiment.
Figure 4:
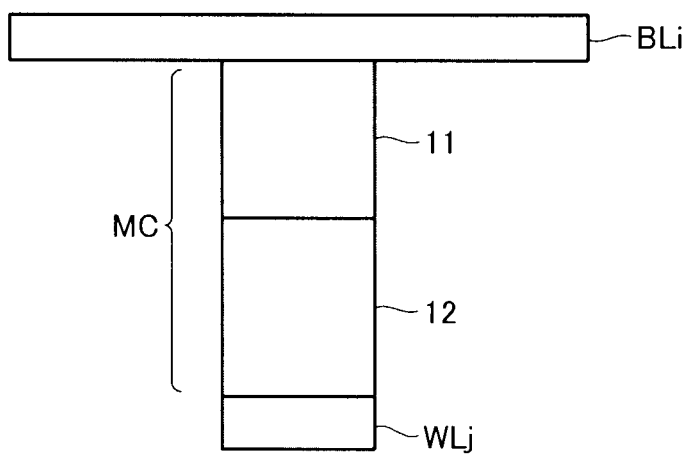
FIG. 4 is a cross sectional view illustrating a configuration of a memory cell of the nonvolatile storage device according to the embodiment.
Figure 5:
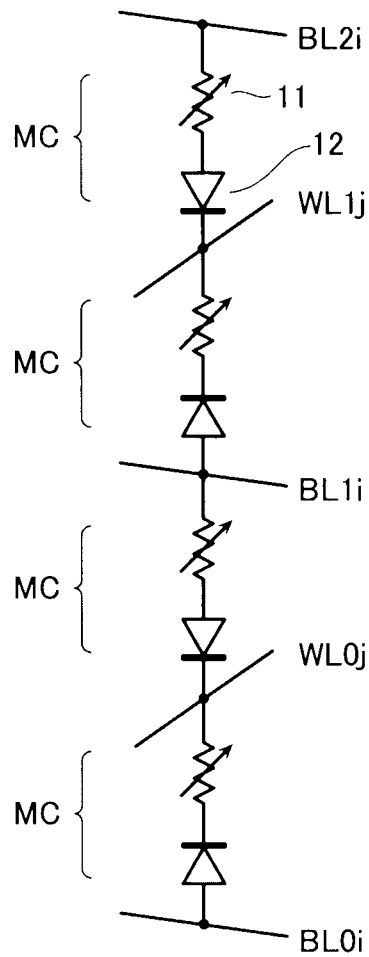
FIG. 5 is a figure illustrating an equivalent circuit of a portion of the memory cell array of the nonvolatile storage device according to the embodiment.

FIG. 2 is a perspective view illustrating a portion of the memory cell array 1. FIG. 3 is a cross sectional view illustrating one column of the memory cell seen in an arrow direction taken along line I-I' in FIG. 2. FIG. 4 is a cross sectional view illustrating one memory cell. FIG. 5 is an equivalent circuit diagram of the memory cell array illustrated in FIG. 3. The memory cell array 1 is a cross point-type memory cell array. In the memory cell array 1, the plurality of word lines WL are arranged in parallel, and the plurality of bit lines BL crossing the word lines WL are arranged in parallel. A memory cell MC described later is arranged at each crossing portion of the word line WL and the bit line BL such that the memory cell MC is sandwiched between both of the wires. Such memory cell arrays MA0 to MA3 are formed as a multilayer with adjacent word lines WL and bit lines BL being shared. It should be noted that the word lines WL and the bit lines BL are desirably made of a material with a high degree of heat resistance and a low resistance value. Examples of such materials include tungsten (W), titanium (Ti), tungsten nitride (WN), titanium nitride (TiN), tungsten silicide (WSi), nickel silicide (NiSi), cobalt silicide (CoSi), tantalum nitride (TaN), and impurity doped Polysilicon.

[Memory Cell MC]

As shown in FIGS. 4 and 5, the memory cell MC includes a variable resistance device 11 and a current rectifying device 12 connected in series between the word line WL and the bit line BL. In the memory cell array in which layers are laminated and arranged in a three-dimensional manner as shown in FIG. 2, the sizes of peripheral circuits connected to the bit line BL and the word line WL crossing each other can be reduced when the bit line BL and the word line WL are configured to be specialized in particular functions different from each other. Therefore, a smaller memory device having the same memory capacity can be achieved. Therefore, in the current rectifying device 12 in the memory cell MC located at the crossing portion of the bit line BL and the word line WL, the current rectifying direction is different depending on whether the bit line BL is located above or below the word line WL. For example, the current rectifying device 12 desirably has such current rectifying characteristics that the current flowed from the bit line BL to the word line WL is larger than the current flowed from the word line WL to the bit line BL in the selected memory cell MC. A cathode/anode of the current rectifying devise 12 is defined by a bias applied direction in a reset operation.

[Current Rectifying Device 12]

The materials, the structure, and the like of the current rectifying device 12 used in the memory cell MC are not particularly limited as long as the current rectifying device 12 has predetermined current rectifying characteristics with regard to voltage/current characteristics. For example, the current rectifying device 12 may be a diode produced from polysilicon (Poly-Si). Examples of the diode include a PN junction diode including a p-type layer and an n-type layer containing impurities. The diode is not limited to the PN junction diode, and other examples of the diode include a Schottky diode, various kinds of diodes such as a PIN diode having an i layer not containing any impurity inserted between a p-type layer and an n-type layer, and a punch-through diode. The material of the current rectifying device 12 is not limited to silicon (Si). The material of the current rectifying device 12 may also be a semiconductor such as silicon germanium (SiGe) and germanium (Ge), a mixed crystal of semiconductor and metal, or an insulating material such as an oxide, so that the current rectifying device 12 has such current rectifying characteristics that desired voltage and current are provided to the resistance change layer of the selected memory cell MC.

[Variable Resistance Device 11]

Data are written to the memory cell MC by applying a predetermined voltage to the variable resistance device 11 of the selected memory cell MC for a predetermined period of time. With this voltage application, the variable resistance device 11 of the selected memory cell MC changes from a high resistance state to a low resistance state. Hereinafter, this operation for changing the variable resistance device 11 from the high resistance state to the low resistance state is referred to as a set operation. On the other hand, data of the memory cell MC are erased by applying a predetermined voltage to the variable resistance device 11 in the low resistance state, after the set operation, for a predetermined period of time. Accordingly, the variable resistance device 11 changes from the low resistance state to the high resistance state. Hereinafter, this operation for changing the variable resistance device 11 from the low resistance state to the high resistance state is referred to as a reset operation. For example, binary data are stored by changing the resistance state of the variable resistance device 11 of the selected memory cell MC to the high resistance state and the low resistance state by performing the reset operation and the set operation on the selected memory cell MC. In the explanation below, the reset operation and the set operation are collectively referred to as switch operation.

Before the configuration of the variable resistance device 11 according to the first embodiment is described, first, a result of experiment uniquely carried out by the present inventors and novel findings obtained thereby will be described. The experiment was carried out in order to improve the chance of success of the reset operation and the set operation when a carbon nano material is used as the variable resistance device.

Figure 6:
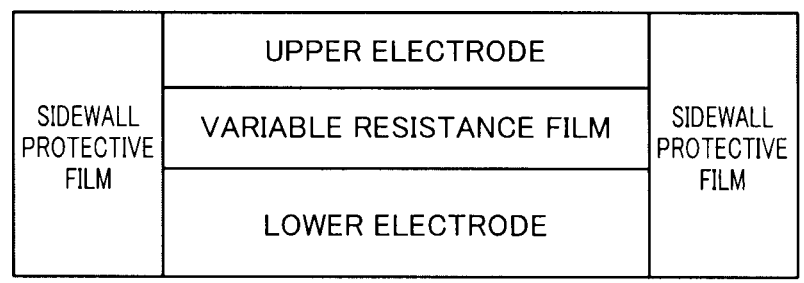
FIG. 6 is a schematic cross sectional view illustrating a device configuration of an experiment sample used in an experiment by the present inventors.

Inventors carried out a series of experiments uniquely using a device as shown in FIG. 6. The device configuration is such that a variable resistance film constituted by carbon nanotubes (CNT) is sandwiched by a lower electrode and an upper electrode, and sidewall protective films are formed to cover side surfaces extending from the lower electrode to the upper electrode. First, how the lower electrode affects switch operation will be described. FIG. 7 illustrates the chance of success of the switch operation in cases where the lower electrode is titanium nitride (TiN) and tungsten (W) respectively. In this case, the chance of success of the switch operation means a chance that the reset operation or the set operation is successfully made six times continuously under a certain measurement condition. The switch operation of the variable resistance film was made by grounding the lower electrode and inputting a positive voltage pulse to the upper electrode side. The upper electrode was made of tungsten (W). The sidewall protective films were made of a silicon nitride film (SiN). As shown in FIG. 7, the chance of success of the switch operation is higher when the lower electrode is made of titanium nitride (TiN) than when it is made of tungsten (W).

Figures 9, 10:
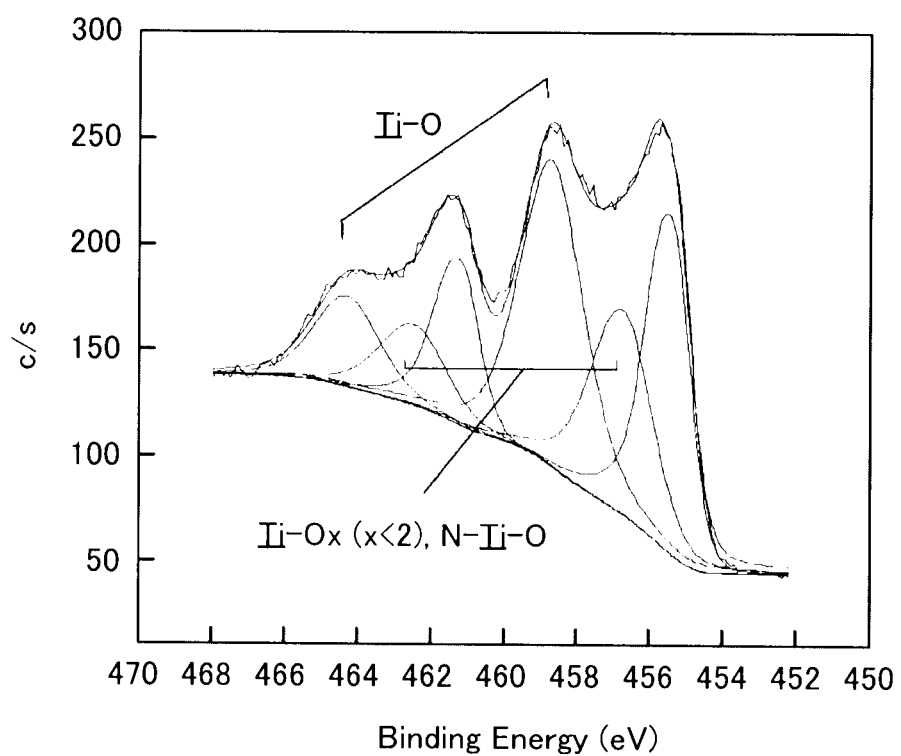
FIG. 9 is a table illustrating the relationship between the polarity and the switch operation characteristic of the experiment sample.
FIG. 10 shows a result of XPS analysis of an interface between a resistance change layer and a lower electrode of the experiment sample.

Subsequently, as shown in FIGS. 8A and 8B, the device having the lower electrode made of titanium nitride (TiN) and the upper electrode made of tungsten (W) was used, and the polarity of the pulse given to the upper electrode was changed. How the switch operation was affected by this change was checked. FIG. 9 shows the result. As shown in FIG. 9, the chance of success of the switch operation is higher when the lower electrode is a cathode and the upper electrode is an anode than when the lower electrode is an anode and the upper electrode is a cathode. As can be understood from the above, the fact that the lower electrode is made of titanium nitride (TiN) is not important but the fact that the cathode is made of titanium nitride (TiN) is important in terms of improving the chance of success of switching.

Subsequently, the interface between the carbon nanotube (CNT) and the titanium nitride (TiN) electrode was analyzed by X-ray Photoelectron Spectroscopy (XPS) method in order to clarify how the cathode made of titanium nitride (TiN) contributes to the improvement of the chance of success of the switch operation. FIG. 10 shows a result of the XPS. The XPS analysis indicates that titanium oxide (TiOx) is formed at the interface between the carbon nanotube (CNT) and the titanium nitride (TiN) electrode. It is not yet clear how the switch operation is affected by the titanium oxide (TiOx) residing at the interface between the carbon nanotube (CNT) and the titanium nitride (TiN) electrode, but it is concluded that the series of results of the above experiments indicate that the fact that the titanium oxide (TiOx) resides at the interface between the cathode electrode and the carbon nanotube (CNT) is important in terms of improving the switch operation.

Figure 11:
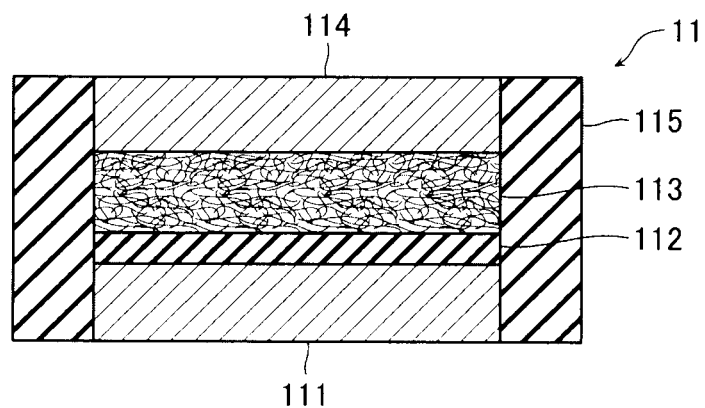
FIG. 11 is a cross sectional view illustrating a configuration of a variable resistance device in the nonvolatile storage device according to the first embodiment of the present invention.

Based on the above results of the experiments uniquely carried out by the present inventors and the obtained novel findings, the variable resistance device 11 according to the present embodiment includes, for example as shown in FIG. 11, a lower electrode 111, an upper electrode 114, a resistance change layer 113 formed to be sandwiched between the lower electrode 111 and the upper electrode 114, an interface layer 112 made of titanium oxide (TiOx) at the interface between the lower electrode 111 and the resistance change layer 113, and a protective film 115 covering sidewalls extending from the lower electrode 111 to the upper electrode 114.

For example, the resistance change layer 113 is made of a carbon nano material such as carbon nanotube (CNT). The shape of the carbon nanotube (CNT) may be single wall, multi-tube, or combination of them both, and the electrical conduction property may be metal-like, semiconductor-like, or a combination of them both. Not only carbon nanotube (CNT) but also carbon nano materials such as fullerene, graphene, and carbon nano-ribbon can be used.

The lower electrode ill may be made of a titanium-containing material such as titanium nitride (TiN) and titanium silicide (TiSi). This is because when the lower electrode 111 is made of a titanium-containing material such as titanium nitride (TiN) and titanium silicide (TiSi), the interface layer 112 made of titanium oxide (TiOx) on the surface of the lower electrode 111 can be formed by oxidizing the lower electrode 111, and the production process is easy. The upper electrode 114 may be a conductive material. For example, the upper electrode 114 may be a conductive metal such as titanium (Ti), zirconium (Zr), hafnium (Hf), tantalum (Ta), tungsten (W), aluminum (Al), and silicon (Si), or an alloy thereof or a nitride thereof. The protective film 115 is made of an insulating substance such as SiN.

In the above example, like the memory cell MC1 and the memory cell MC3 in FIG. 3, it is assumed that the lower electrode 111 is provided at the cathode side and the upper electrode 114 is provided at the anode side so that the current flows from the side of the upper electrode 114 to the side of the lower electrode 111.

When the lower electrode 111 is provided at the anode side and the upper electrode 114 is provided at the cathode side like the memory cell MC0 and memory cell MC2 in FIG. 3, titanium oxide (TiOx) is formed between the upper electrode 114 and the variable resistance change layer 113. When the lower electrode 111 is provided at the anode side and the upper electrode 114 is provided at the cathode side, the lower electrode 111 may not necessarily be the titanium-containing material as long as it is a conductive material. For example, the lower electrode 111 may be a conductive metal such as titanium (Ti), zirconium (Zr), hafnium (Hf), tantalum (Ta), tungsten (W), aluminum (Al), and silicon (Si), or an alloy thereof or a nitride thereof.

According to the above configuration, based on the above results of the experiments uniquely carried out by the present inventors and the obtained novel findings, a nonvolatile storage device providing preferable switch operation even in the memory cell MC having any current rectifying direction of MC0, MC1 in FIG. 3 can be provided without relying on the current rectifying direction of the current rectifying device.

[Second Embodiment]

Subsequently, the nonvolatile storage device according to the second embodiment of the present invention will be described. The entire configuration of the semiconductor storage device according to the present embodiment is the same as that in the first embodiment, and detailed description thereabout is omitted. Portions having the same configurations as those of the first embodiment are denoted with the same reference numerals, and description thereabout is omitted.

In the memory cell MC in which the lower electrode is an anode and the upper electrode is a cathode as shown in MC0, MC2 of FIG. 3, there is spatial clearance in the film of the carbon nano material used as the resistance change layer 113. Therefore, during the production step for forming the interface layer 112 on the resistance change layer 113, titanium (Ti), i.e., an element constituting the interface layer 112, soaks into the resistance change layer 113, and there is a problem in that the interface layer 112 cannot be uniformly formed on the resistance change layer 113.

Figure 12:
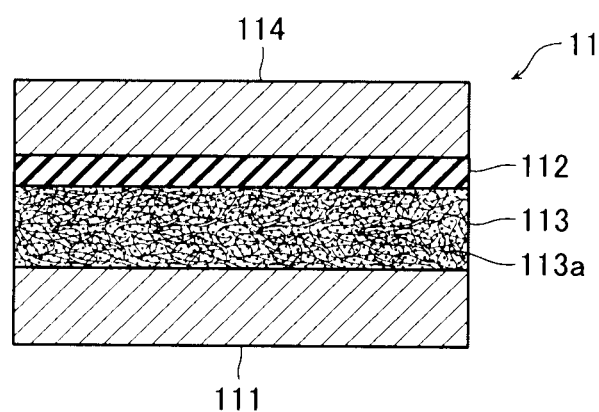
FIG. 12 is a cross sectional view illustrating a configuration of a variable resistance device in a nonvolatile storage device according to a second embodiment of the present invention.

In the present embodiment, as shown in FIG. 12, an insulating material 113a is filled to eliminate the spatial clearance of the resistance change layer 113 in order to solve such a problem. As a result, a flat surface can be formed on the resistance change layer 113, and the interface layer 112 can be uniformly formed thereon.

In this example, the lower electrode 111 is the anode, and the upper electrode 114 is the cathode. However, even when the lower electrode 111 is a cathode and the upper electrode 114 is an anode, this can also be applied in order to prevent cumbersomeness in the production process by making the production process the same.

[Third embodiment]

Subsequently, the third embodiment of the present invention will be described. The entire configuration of the semiconductor storage device according to the present embodiment is the same as that in the first embodiment, and detailed description thereabout is omitted. Portions having the same configurations as those of the first embodiment are denoted with the same reference numerals, and description thereabout is omitted.

Figure 13:
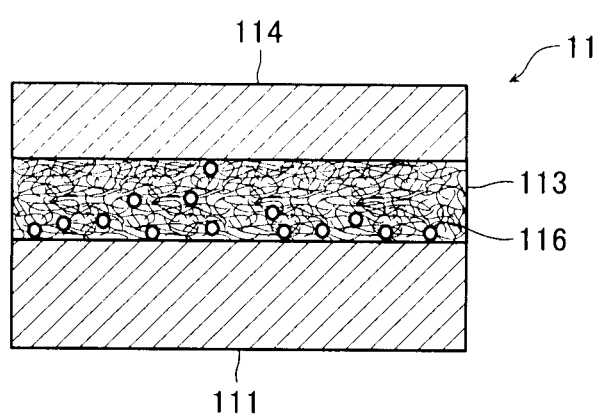
FIG. 13 is a cross sectional view illustrating a configuration of a variable resistance device in a nonvolatile storage device according to a third embodiment of the present invention.

As shown in FIG. 13, a variable resistance device 11 according to the present embodiment does not have any titanium oxide (TiOx) film formed between the lower electrode 111 and the resistance change layer 113. Instead, a nanostructure 116 including titanium (Ti) and oxygen (O) exists in the resistance change film 113.

The variable resistance device 11 according to the present embodiment is produced as follows. That is, a lower electrode 111, a carbon nano material film serving as a resistance change layer 113, and an upper electrode 114 are formed on a substrate. Thereafter, this is divided into a plurality of variable resistance devices 11 by a method such as reactive ion etching (RIE). In this case, any one of the lower electrode 111 and the upper electrode 114 is made of a titanium-containing material such as titanium nitride (TiN) or mixed crystal of titanium and silicon (TiSi). The carbon nano material film used as the resistance change layer 113 includes spatial gap in a mesh form. Therefore, the residue produced when the upper electrode 114 and the lower electrode 111 are cut soaks into the carbon nano material film as the nanostructure 116 including titanium (Ti) and oxygen (O). According to the present embodiment, the step of depositing the titanium oxide (TiOx) can be omitted.

[Other]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile storage device comprising a resistance change device including:
    a first electrode;
    a second electrode; and
    a resistance change layer including a conductive nano material formed between the first electrode and the second electrode and including a spatial gap in a mesh form,
    the resistance change layer including a nanostructure including titanium (Ti) and oxygen (O) and existing in the spatial gap.

2. The nonvolatile storage device according to claim 1, wherein the nonvolatile storage device is formed by laminating a plurality of memory cell arrays, the memory cell array including a plurality of word lines arranged in parallel, a plurality of bit lines arranged in parallel and crossing these word lines, and memory cells each connected between a word line and a bit line at a crossing portion between the word line and the bit line, the plurality of memory cell arrays being laminated in such a manner as to share word lines or bit lines of adjacent memory cell arrays,
    wherein the memory cell includes a current rectifying device and a variable resistance device connected in series.

3. The nonvolatile storage device according to claim 1, wherein the conductive nano material included in the resistance change layer is a carbon nano material.

4. The nonvolatile storage device according to claim 1, wherein the first electrode is made of titanium nitride (TiN), titanium silicide (TiSi) or other titanium-containing materials.

5. The nonvolatile storage device according to claim 1, wherein the second electrode is made of titanium nitride (TiN), titanium silicide (TiSi) or other titanium-containing materials.

6. The nonvolatile storage device according to claim 1, wherein the nanostructure is a residue produced when the first electrode and the second electrode are cut.

7. The nonvolatile storage device according to claim 1, wherein a sidewall protective film covering a sidewall of the first electrode, the resistance change layer, and the second electrode is formed.

8. The nonvolatile storage device according to claim 7, wherein the sidewall protective film is made of a silicon nitride (SiN) film.

* * * * *